US006748575B1

(12) United States Patent
Feng et al.

(10) Patent No.: US 6,748,575 B1
(45) Date of Patent: *Jun. 8, 2004

(54) PROGRAMMING PROGRAMMABLE LOGIC DEVICES USING HIDDEN SWITCHES

(75) Inventors: Wenyi Feng, Allentown, PA (US); William A. Oswald, Allentown, PA (US); Michael L. Roy, Westminster, CO (US); Eric Ting, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/263,251

(22) Filed: Oct. 2, 2002

Related U.S. Application Data

(63) Continuation of application No. 09/818,257, filed on Mar. 27, 2001, now Pat. No. 6,496,969.

(51) Int. Cl.[7] .............................................. H03K 19/177
(52) U.S. Cl. .......................................... 716/12; 326/41
(58) Field of Search ............................. 716/12, 13, 14, 716/15, 16, 17; 326/41, 47, 39

(56) References Cited

U.S. PATENT DOCUMENTS 4,845,633 A  *  7/1989  Furtek ...................... 326/38
4,870,302 A      9/1989  Freeman .................... 307/465
5,448,493 A      9/1995  Topolewski et al. ........ 364/489
5,649,163 A  *  7/1997  Pedersen .................... 703/23
6,160,420 A     12/2000  Gamal et al. ................ 326/41
6,294,928 B1     9/2001  Lytle et al. .................. 326/34

* cited by examiner

Primary Examiner—Tuan T. Lam
Assistant Examiner—Linh M. Nguyen
(74) Attorney, Agent, or Firm—Steve Mendelsohn

(57) ABSTRACT

A programming tool for programmable logic devices (PLDs), such as field programmable gate arrays (FPGAs), supports the display of hidden-switch connections, in addition to the display of conventional placed-switch, switchbox, and pseudo-arc connections. A hidden-switch connection between two functional elements in the PLD is represented in graphical displays generated by the programming tool as a curve (e.g., a diagonal straight line) from a jumper wire on the first functional element to another jumper wire on the second functional element, where a jumper wire is represented in the graphical display as a wire connected at one end to an pin of the corresponding functional element and unconnected at the other end. A programming tool that supports hidden-switch connections can be used to program FPGAs and other PLDs having architectures that were not previously supported by conventional programming tools that do not support hidden-switch connections.

19 Claims, 8 Drawing Sheets

PROGRAMMING PROGRAMMABLE LOGIC DEVICES USING HIDDEN SWITCHES

CROSS-REFERENCE TO RELATED APPLICATIONS

This is a continuation of application Ser. No. 09/818,257, filed on Mar. 27, 2001 as the teachings of which are incorporated herein by reference now U.S. Pat. No. 6,496,969.

BACKGROUND OF THE INVENTION

1. Field of the Invention

The present invention relates to integrated circuits, and, in particular, to software tools used to program field programmable gate arrays (FPGAs) and other programmable logic devices.

2. Description of the Related Art

FIG. 1 shows a simplified schematic block diagram of a conventional FPGA 100 comprising a (2×2) array of programmable blocks. Each block in FPGA 100 comprises a programmable function unit (PFU) 102 and a supplemental logic and interconnect cell (SLIC) 104. Connected to these blocks are input/output (I/O) blocks. Each I/O block comprises four programmable I/O units (PIOs) connected to a programmable switch box. For example, four PIOs 106 are connected to programmable switch box 108, and four PIOs 110 are connected to programmable switch box 112. In addition, FPGA 100 is configured with horizontal and vertical wiring that provide routing resources for connecting the various functional elements (e.g., PIOs, PFUs, and SLICs) within the FPGA. For example, switch box 108 is configured to be programmed to enable PIOs 106 to drive certain vertical wires 114, while switch box 112 is configured to be programmed to enable PIOs 110 to drive certain horizontal wires 116. In addition to switch boxes, such as switch boxes 108 and 112, which provide programmable interconnects between two different sets of wires, FPGA 100 also has programmable placed switches 118, each of which enables a corresponding pair of intersecting horizontal and vertical wires to be connected (e.g., vertical wires 114 and horizontal PFU wires 120 or horizontal wires 116 and vertical PFU wires 122). FPGA 100 will typically include much more routing resources to, from, and between the various functional elements than that shown in FIG. 1, as well as additional programmable switches and other logic components.

In general, an FPGA is a particular type of a programmable logic device (PLD) that can be programmed by the user for any of a wide range of specific applications. In theory, an FPGA, such as FPGA 100 of FIG. 1, is provided with routing resources to connect (i.e., route) any pin on any component (e.g., a PFU, SLIC, or PIO) within the FPGA to any other pin on any other component within the FPGA. These connections are made by programming one or more programmable switches in the FPGA to establish a contiguous wiring path between the two pins. For example, in FIG. 1, PIO 106-1 can be connected to pin 2 of PFU 102 by (i) programming switch box 108 to connect PIO 106-1 to vertical wire 114 and (ii) programming placed switch 118 to connect vertical wire 114 to horizontal wire 120, which is hard-wired to pin 2 of PFU 102.

Special software tools have been developed for programming FPGAs. One such programming tool is the Epic™ program provided to customers of FPGAs sold by Agere Systems Inc. of Berkeley Heights, N.J. Programming tools like the Epic™ program can be used by a programmer to generate graphical displays showing representations of the current programming of the FPGA. Although these graphical representations may conform generally to the actually physical design and layout of the physical FPGA chip, in fact, they are merely representations of the functionality provided by the FPGA. As such, the appearance of functional elements and routing resources in the graphical displays generated by the programming tool need not correspond identically to those in the actual FPGA device.

In conventional software tools for programming FPGAs, different types of switches are typically supported. As described previously in the context of FIG. 1, an FPGA may have both programmable switch boxes, such as switch boxes 108 and 112 as well as programmable placed switches, such as placed switches 118.

FIG. 2 shows a schematic representation of a placed switch 200, similar to placed switch 118 of FIG. 1. Placed switch 200 can be programmed to connect horizontal wire 202 with "intersecting" vertical wire 204. When placed switch 200 is on, it provides a connection between wires 202 and 204, and, when placed switch 200 is off, it does not provide such a connection. In conventional programming tools for FPGAs, in order for a horizontal wire to be connected to a vertical wire by a placed switch, the two wires must intersect one another in the graphical display of the FPGA generated by the programming tool.

FIG. 3 shows a schematic representation of a switch box 300, similar to switch boxes 108 and 112 of FIG. 1. In theory, switch box 300 can be implemented to programmably connect independently any of input wires 302 to any of output wires 304. If the two input wires 302 are labeled A and B and the two output wires 304 are labeled C and D, switch box 300 can be programmed in any of the sixteen different combinations of connections listed in Table I. In conventional programming tools for FPGAs, in order for an input wire to be connected to an output wire by a switch box, the two wires must be connected to the switch box in the graphical display of the FPGA generated by the programming tool.

TABLE I

| Combination # | Connections |
| --- | --- |
| 1 | None |
| 2 | A→C |
| 3 | A→D |
| 4 | B→C |
| 5 | B→D |
| 6 | A→C and B→D |
| 7 | A→D and B→C |
| 8 | A→C and A→D |
| 9 | B→C and B→D |
| 10 | A→C and B→C |
| 11 | A→D and B→D |
| 12 | A→C and A→D and B→C |
| 13 | A→C and A→D and B→D |
| 14 | A→C and B→C and B→D |
| 15 | A→D and B→C and B→D |
| 16 | A→C and A→D and B→C and B→D |

FIG. 4 shows a schematic representation of a pseudo arc, another type of switch connection. A pseudo arc is the connection provided from an input wire 402 to an output wire 404 through a logic element 400, such as a PFU or a SLIC. Typically, a pseudo arc is a conditional switch connection that depends on the logic implemented within element 400. In conventional programming tools for FPGAs, in order for an input wire to be connected to an output wire via a pseudo arc, the two wires must be connected to the same logic element in the graphical display of the FPGA generated by the programming tool.

FIG. 5 shows an example of a graphical display generated by the Epic™ program for a particular FPGA. FIG. 5 shows a display representing the entire FPGA in a single view. For a typical application, an FPGA such as that shown in FIG. 5 will be programmed with a large number of connections between the various functional elements. In order to be useful to programmers, the Epic™ program enables a programmer to generate displays that selectively reveal individual wiring routes between particular functional elements, including the programming of the individual switches that provide those routes. In addition, the Epic™ program can display all possible connections from a selected switch-box pin. The Epic™ program also enables a programmer to zoom in on any selected region of the display.

FIG. 6 shows an example of a graphical display of one particular region of the FPGA shown in FIG. 5. In particular, FIG. 6 shows a switch box 600 having a number of input pins 602 and a number of output pins 604. In the display of FIG. 6, no connections are shown between any of the input and output pins.

FIG. 7 shows an example of a graphical display of switch box 600 of FIG. 6 displaying all of the possible switch-box connections 702 involving a particular input pin 602. As shown in FIG. 7, switch box 600 can be independently programmed to provide a different switch-box connection 702 from input pin 602 to each different output pin 604.

FIG. 8 shows an example of a graphical display of an entire route from output pin 804 of PFU 802 to input pin 810 of SLIC 812. In particular, the entire route consists of (1) wire 806 connecting output pin 804 to input pin 602 of switch box 600, (2) switch-box connection 702 connecting input pin 602 to output pin 604 of switch box 600, and (3) wire 808 connecting output pin 604 to input pin 810 of SLIC 812.

In order for an FPGA to be programmed with a particular route, two requirements must be satisfied: (1) the set of actual connections that provide the particular route must be able to be made in the actual FPGA and (2) the set of actual connections that provide the particular route must be able to be represented in the graphical displays generated by the programming tool used to program the actual FPGA. Since the programming tool relies on a representation of the actual FPGA configuration, being able to satisfy the first requirement does not necessarily mean that the second requirement will also be able to be satisfied.

In general, the types of connections (e.g., switch boxes, placed switches, and pseudo arcs) that are supported by conventional programming tools for FPGAs, such as the Epic™ program, have imposed constraints on the architectures of the actual FPGAs, because certain connections that could in theory be supported in actual FPGAs could not be represented using the types of connections supported by the conventional programming tools. For example, the types of connections supported by conventional programming tools require two wires to be co-located in the display generated by the programming tool in order for those wires to be connected. This means that the two wires have to either intersect one another or terminate at the same functional element. As a result, the number of different pins that could be designed into a particular functional element in the actual FPGA was limited by the number of corresponding wires connected to those pins that could be effectively represented in the graphical displays generated by the programming tool.

As such, there was no point in designing FPGAs with functional elements having more than this number of pins, since such FPGAs could not be efficiently or reliably programmed using conventional programming tools. As such, FPGAs have not been designed with such architectures.

SUMMARY OF THE INVENTION

The present invention is directed to a software tool for programming an FPGA that provides a novel technique for representing connections within an FPGA. In particular, in addition to all of the conventional placed switches, switch boxes, and pseudo arcs, embodiments of the present invention are able to represent FPGA connections using hidden switches. A hidden-switch connection is a connection between two functional elements that is represented in the graphical display generated by an FPGA programming software tool without explicitly representing the one or more switch devices that would provide the corresponding connection in the actual FPGA. In particular, a hidden-switch connection is represented in the graphical display as a curve (e.g., a diagonal straight line) from a jumper wire on one functional element to another jumper wire on another functional element, where a jumper wire is represented in the graphical display as a wire connected at one end to a pin of the corresponding functional element and unconnected at the other end.

In one embodiment, the present invention is a method for representing programming for a programmable logic device (PLD), comprising the steps of (a) storing a software representation of the PLD; and (b) generating, based on the software representation of the PLD, a graphical display representing a hidden-switch connection between first and second functional elements in the PLD, wherein, in the graphical display, the hidden-switch connection is represented by a curve from a first jumper wire at a pin of the first functional element to a second jumper wire at a pin of the second functional element, wherein each jumper wire is represented as being connected to the corresponding pin of the corresponding functional element at a first end of the jumper wire and unconnected at a second end of the jumper wire.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 9:
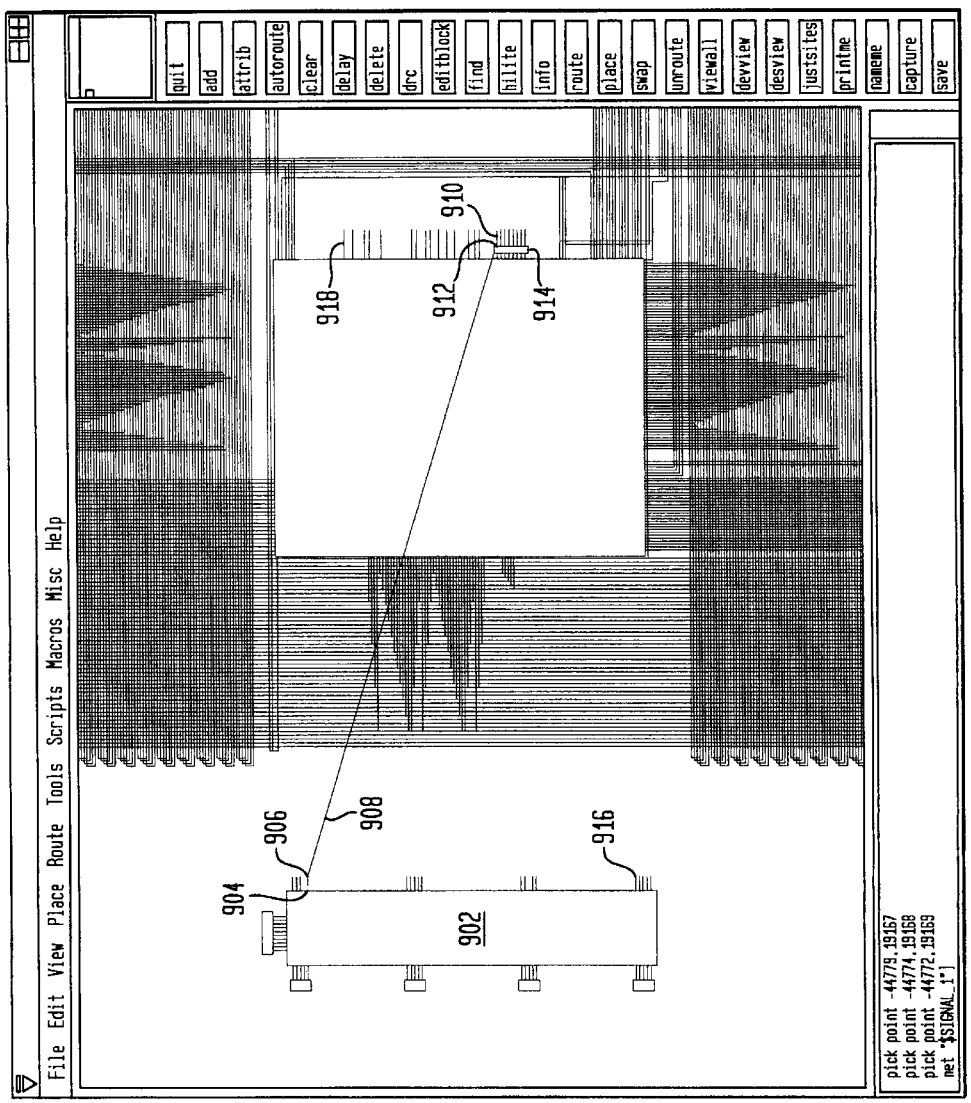
FIG. 9 shows an example of a graphical display of a hidden-switch connection generated by a programming tool for FPGAs, according to one embodiment of the present invention.

FIG. 9 shows an example of a graphical display of a hidden-switch connection generated by a programming tool for FPGAs, according to one embodiment of the present invention. In particular, the display of FIG. 9 represents a hidden-switch connection between pin 904 of switch box 902 and pin 912 of switch box 914. As shown in FIG. 9, the hidden-switch connection is represented by (1) jumper wire 906 connected to pin 904 of switch box 902, (2) jumper wire 910 connected to pin 912 of switch box 914, and diagonal line 908 connecting jumper wire 906 to jumper wire 910. Note that FIG. 9 shows many other jumper wires, such as jumper wires 916 and 918, which correspond to other hidden-switch connections already programmed into the FPGA that are not currently selected to be displayed.

Conventional connections, such as placed-switch, switch-box, and pseudo-arc connections, are all based on explicit representations of physical switch devices in the actual FPGA that provide the connections (i.e., placed switches, switch boxes, and logic elements). Moreover, the input and output wires for such conventional connections must be co-located in the displays generated by the programming tool (e.g., intersecting in the case of placed-switch connections and terminating at the same functional element in the case of switch-box and pseudo-arc connections). A hidden-switch connection does not share those characteristics. In particular, a hidden-switch connection is represented in the graphical displays generated by the programming tool of the present invention without explicitly representing the physical switch devices that provide the physical connection in the actual FPGA. In that sense, those corresponding physical switch devices may be said to be hidden. Furthermore, the two wires involved in a hidden-switch connection are represented by a pair of jumper wires that do not have to be co-located in the displays generated by the programming tools.

Figure 10:
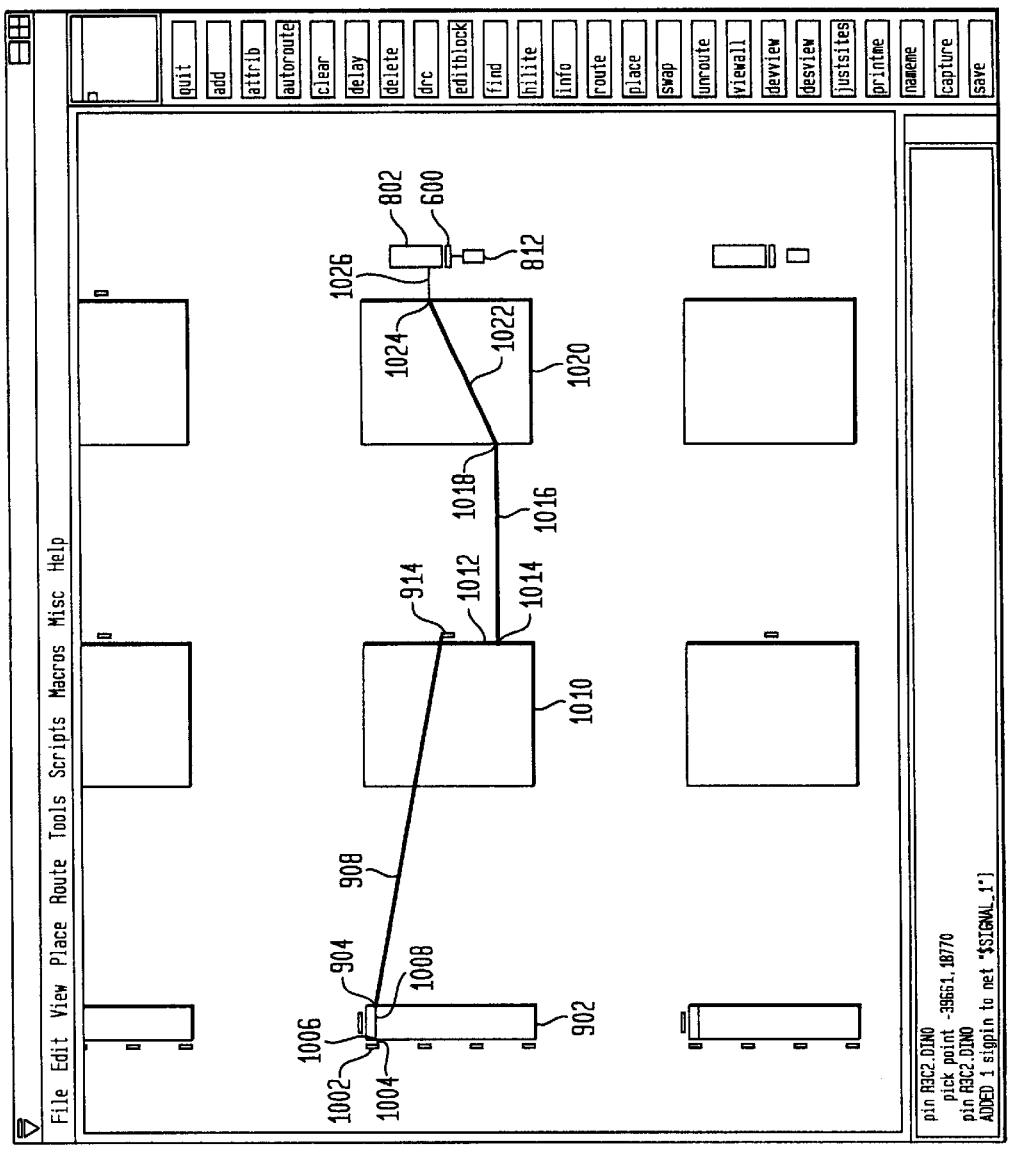
FIG. 10 shows an example of a graphical display generated by a programming tool of the present invention representing two routes.

FIG. 10 shows an example of a graphical display generated by a programming tool of the present invention representing two routes through numerous functional elements (i.e., switch boxes 902, 914, 1010, 1020, and 600 and PFU 802) that include the hidden-switch connection of FIG. 9 along with a number of conventional connections: a first route from PIO 1002 to PFU 802 and a second route from PFU 802 to SLIC 812. In particular, the first route of FIG. 10 includes:

Conventional wire 1004 connecting PIO 1002 to input pin 1006 of switch box 902;

Conventional switch-box connection 1008 connecting input pin 1006 of switch box 902 to output pin 904 of switch box 902;

The hidden-switch connection of FIG. 9 consisting of diagonal line 908 connecting jumper wire 906 at output pin 904 of switch box 902 to jumper wire 910 at input pin 912 of switch box 914;

A conventional switch-box connection connecting input pin 912 of switch box 914 to an output pin of switch box 914;

A conventional wire connecting that output pin of switch box 914 to an input pin of switch box 1010;

Conventional switch-box connection 1012 connecting that input pin of switch box 1010 to output pin 1014 of switch box 1010;

Conventional wire 1016 connecting output pin 1014 of switch box 1010 to input pin 1018 of switch box 1020;

Conventional switch-box connection 1022 connecting input pin 1018 of switch box 1020 to output pin 1024 of switch box 1020; and Conventional wire 1026 connecting output pin 1024 of switch box 1020 to an input pin of PFU 802.

Figure 1:
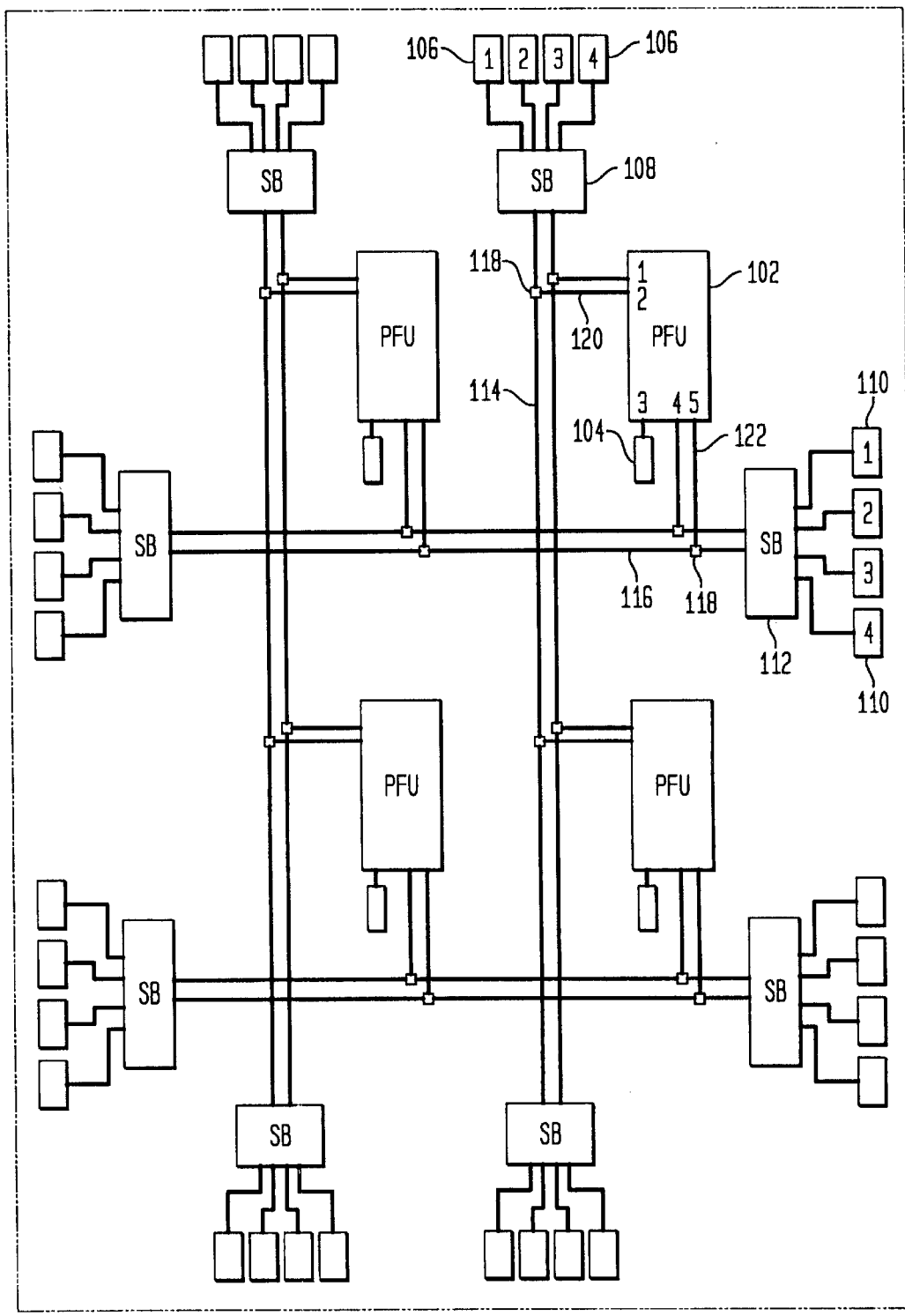
FIG. 1 shows a simplified schematic block diagram of a conventional FPGA comprising a (2×2) array of programmable blocks.
Figure 2:
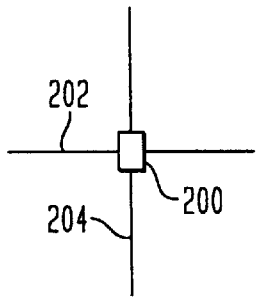
FIG. 2 shows a schematic representation of a placed switch.
Figure 3:
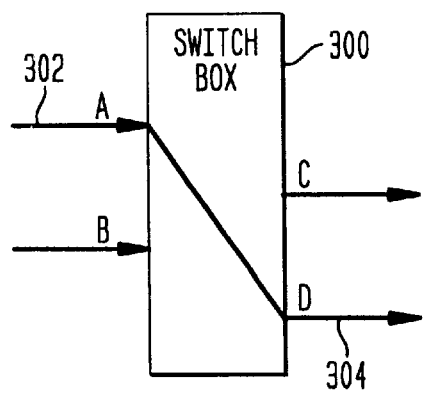
FIG. 3 shows a schematic representation of a switch box.
Figure 4:
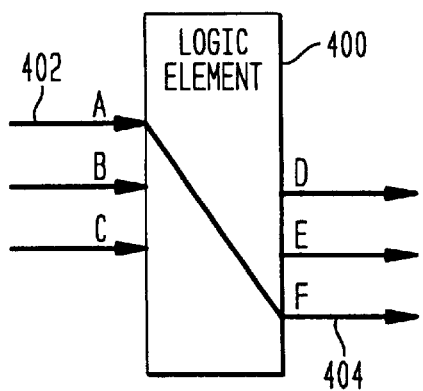
FIG. 4 shows a schematic representation of a pseudo arc.
Figure 5:
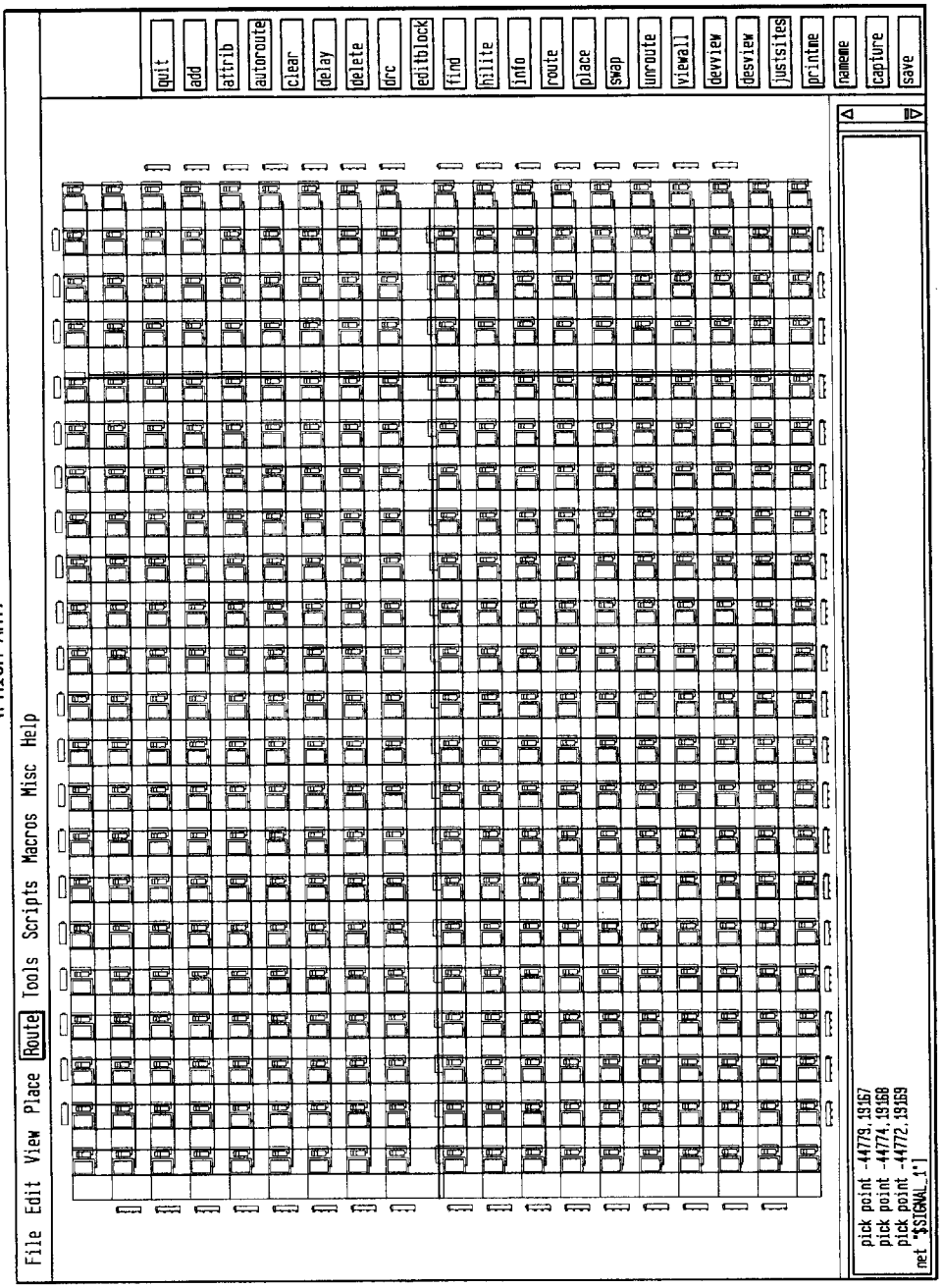
FIG. 5 shows an example of a graphical display generated by the Epic™ program for a particular FPGA.
Figure 6:
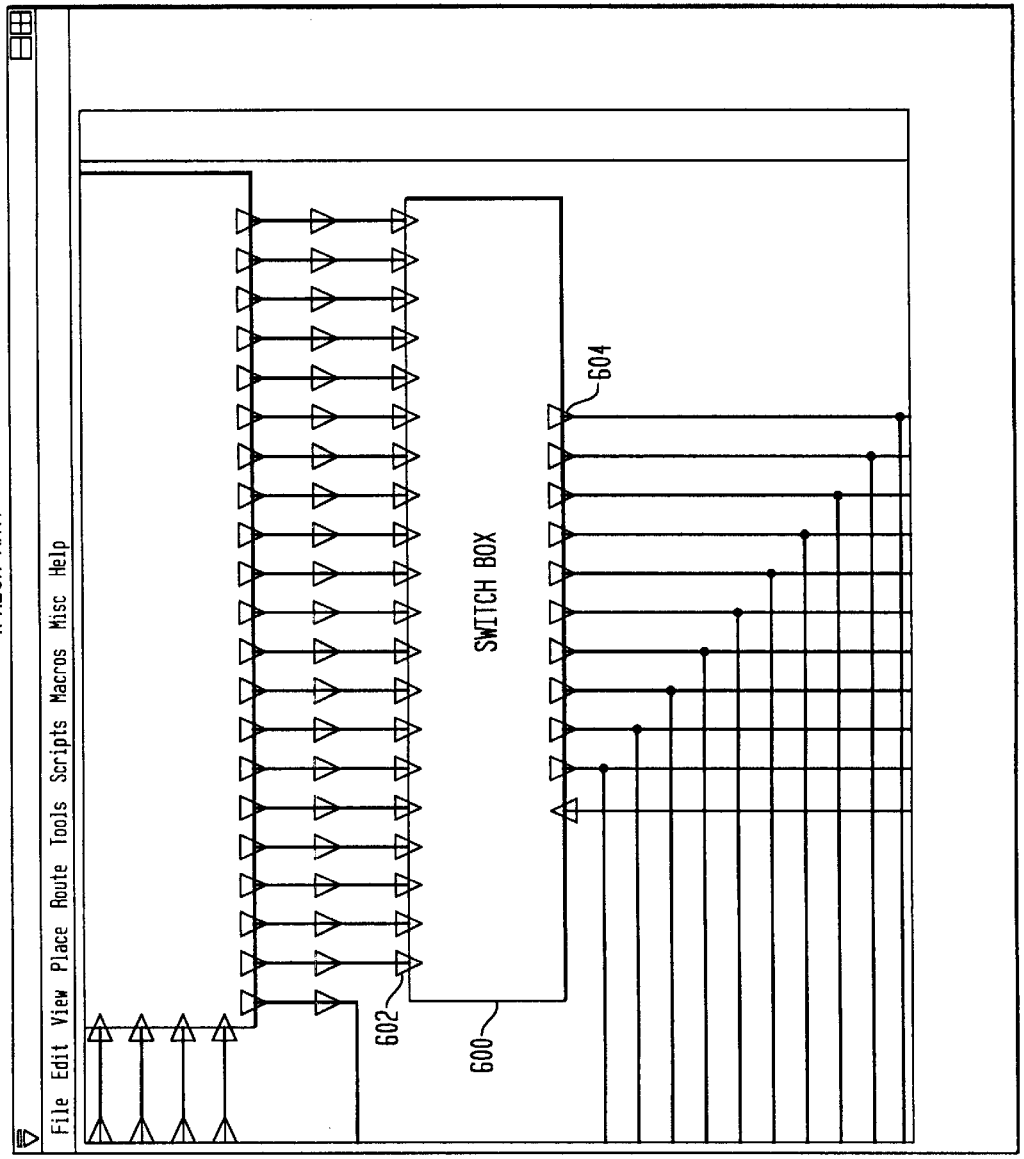
FIG. 6 shows an example of a graphical display of one particular region of the FPGA shown in FIG. 5.
Figure 7:
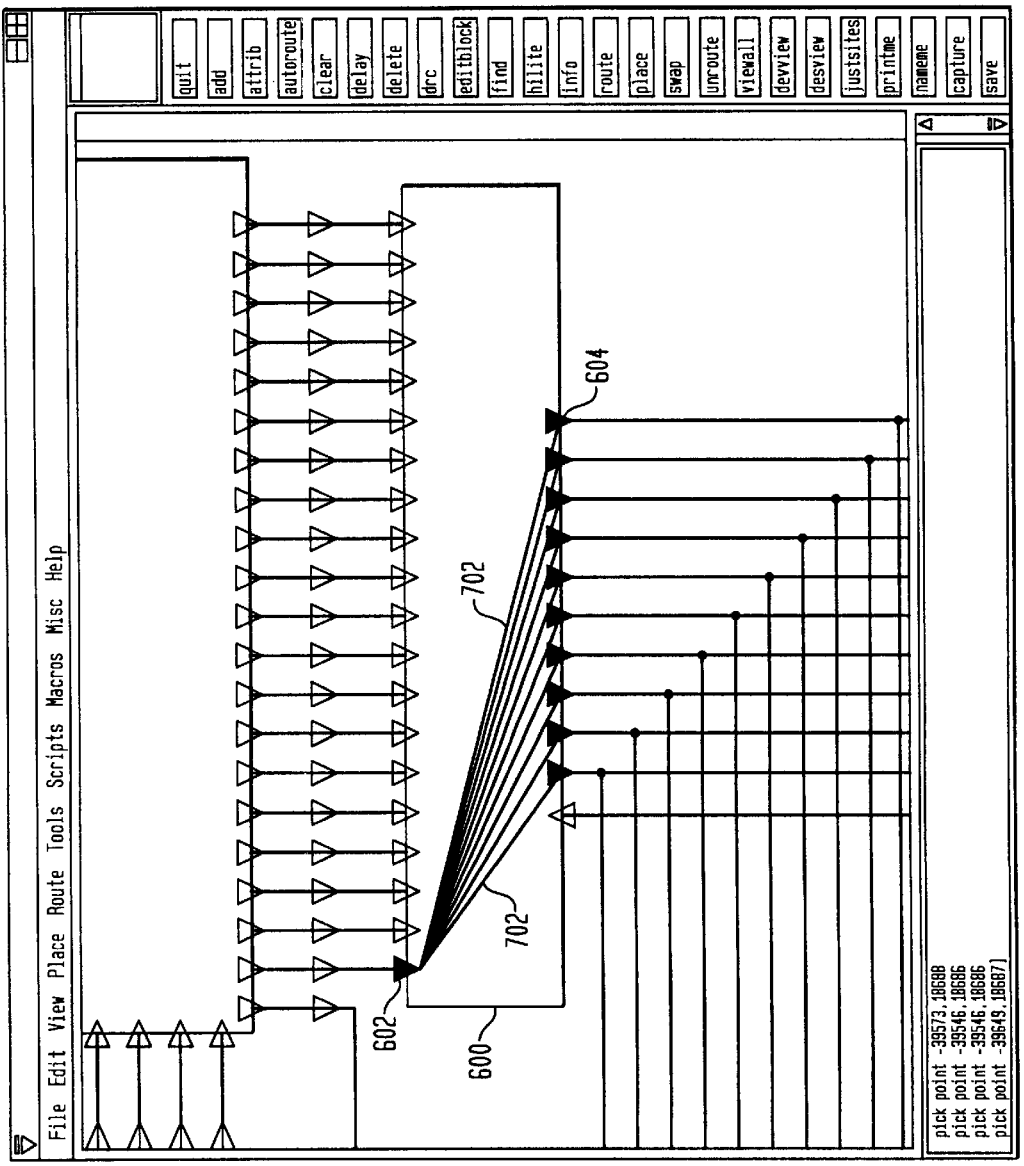
FIG. 7 shows an example of a graphical display of the switch box of FIG. 6.
Figure 8:
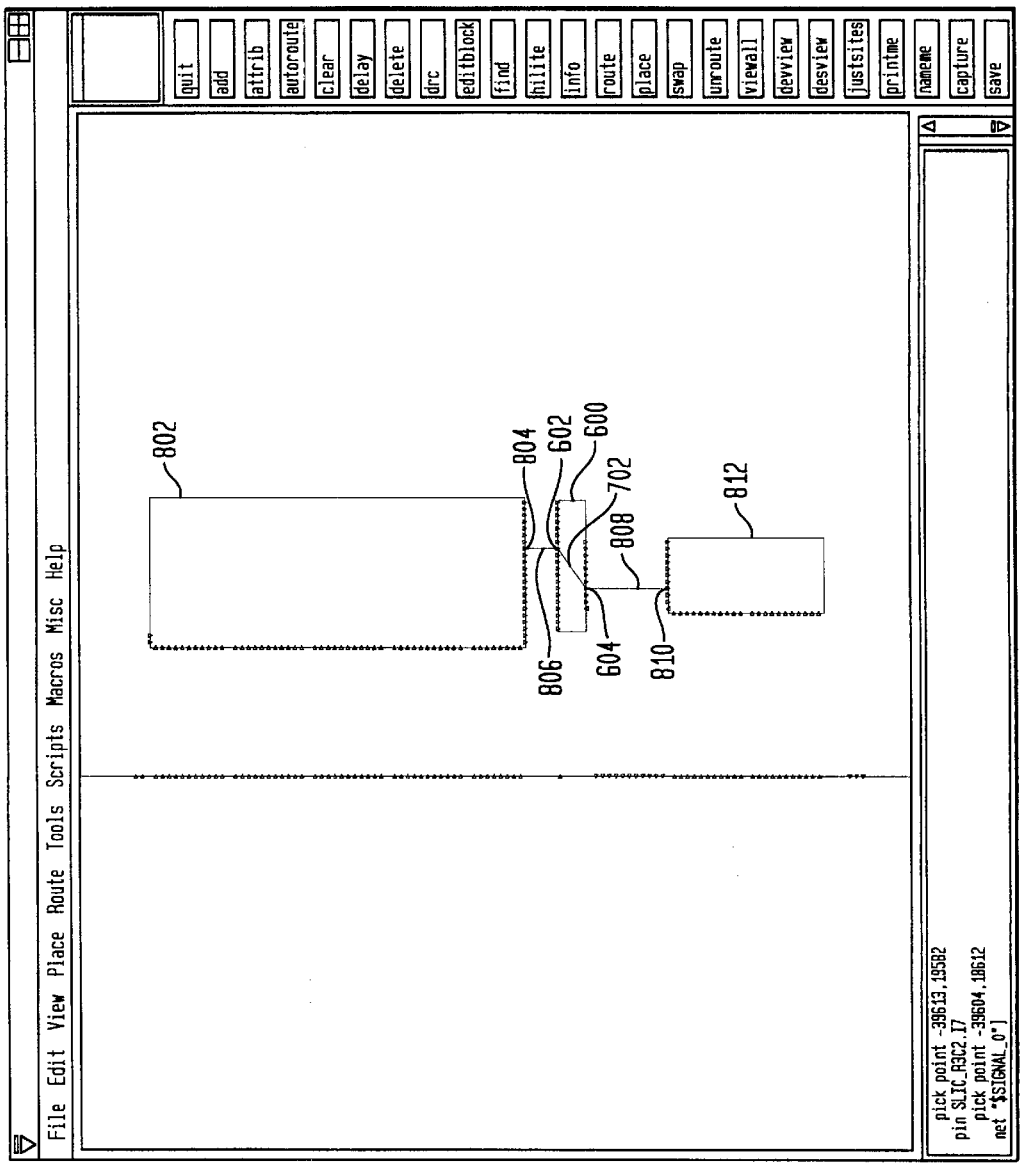
FIG. 8 shows an example of a graphical display of an entire route.

The second route of FIG. 10 includes:

Conventional wire 806 connecting output pin 804 of PFU 802 to input pin 602 of switch box 600 (as shown more clearly in FIG. 8);

Conventional switch-box connection 702 connecting input pin 602 of switch box 600 to output pin 604 of switch box 600 (as shown more clearly in FIG. 8); and Conventional wire 808 connecting output pin 604 of switch box 600 to input pin 810 of SLIC 812 (as shown more clearly in FIG. 8).

A programming tool for FPGAs that supports hidden-switch connections, in addition to conventional placed-switch, switch-box, and pseudo-arc connections, allows a wider variety of architectures for the FPGA being programmed. In particular, since connections can be represented as being provided by hidden switches, the number of pins that can be designed into a particular functional element is no longer limited to the number of wires connected to that functional element that can be efficiently represented in the graphical display generated by the programming tool. In particular, the process of generating the software model of a particular FPGA hardware design for use in the programming tool is much easier with the addition of hidden-switch connections. As such, FPGAs having functional elements with greater numbers of pins are much more easily realizable with the present invention than with the prior-art programming tools.

Although the present invention has been described in the context of FPGAs, those skilled in the art will understand that the present invention can be implemented in the context of other types of programmable logic devices, such as a field programmable system on a chip (FPSC) or an embedded FPGA (EFPGA), which is an array of programmable logic embedded within an application specific integrated circuit (ASIC).

The present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for representing programming for a programmable logic device (PLD), comprising:

(a) storing a software representation of the PLD; and (b) generating, based on the software representation of the PLD, a graphical display representing a hidden-switch connection between first and second functional elements in the PLD.

2. The invention of claim 1, wherein the hidden-switch connection is represented in the graphical display without explicitly representing any particular physical switch device that would provide a corresponding physical connection in the PLD.

3. The invention of claim 1, wherein at least one of the first and second functional elements has a greater number of pins than can be represented in the graphical display using conventional wires in which one each conventional wire is terminated at a different pin.

4. The invention of claim 1, wherein, in the graphical display, the hidden-switch connection is an abstract representation of a physical connection between the first and second functional elements, wherein the abstract representation does not correspond to the routing of the physical connection in the PLD.

5. The invention of claim 4, wherein, in the graphical display, the hidden-switch connection is represented by a curve from a first jumper wire at a pin of the first functional element to a second jumper wire at a pin of the second functional element, wherein each jumper wire is represented as being connected to the corresponding pin of the corresponding functional element at a first end of the jumper wire and unconnected at a second end of the jumper wire.

6. The invention of claim 5, wherein the curve is a straight line interconnecting the first and second jumper wires.

7. The invention of claim 5, wherein each jumper wire is represented as either a horizontal or vertical line segment.

8. The invention of claim 5, wherein, when the hidden-switch connection is not selected to be displayed, the graphical display retains representations of the first and second jumper wires.

9. The invention of claim 5, wherein jumper wires are represented in the graphical display only if the PLD program has a corresponding hidden-switch connection.

10. The invention of claim 5, wherein the first and second jumper wires do not intersect in the graphical display and do not terminate at a single common functional element.

11. The invention of claim 1, wherein the PLD is an FPGA.

12. A machine-readable medium, having encoded thereon program code, wherein, when the program code is executed by a machine, the machine implements a method for representing programming for a programmable logic device (PLD), comprising:

(a) storing a software representation of the PLD; and (b) generating, based on the software representation of the PLD, a graphical display representing a hidden-switch connection between first and second functional elements in the PLD.

13. The invention of claim 12, wherein the hidden-switch connection is represented in the graphical display without explicitly representing any particular physical switch device that would provide a corresponding physical connection in the PLD.

14. The invention of claim 12, wherein at least one of the first and second functional elements has a greater number of pins than can be represented in the graphical display using conventional wires in which one each conventional wire is terminated at a different pin.

15. The invention of claim 12, wherein, in the graphical display, the hidden-switch connection is an abstract representation of a physical connection between the first and second functional elements, wherein the abstract representation does not correspond to the routing of the physical connection in the PLD.

16. A tool for programming a programmable logic device (PLD), comprising:

(a) means for storing a software representation of the PLD; and (b) means for generating, based on the software representation of the PLD, a graphical display representing a hidden-switch connection between first and second functional elements in the PLD.

17. The invention of claim 16, wherein the hidden-switch connection is represented in the graphical display without explicitly representing any particular physical switch device that would provide a corresponding physical connection in the PLD.

18. The invention of claim 16, wherein at least one of the first and second functional elements has a greater number of pins than can be represented in the graphical display using conventional wires in which one each conventional wire is terminated at a different pin.

19. The invention of claim 16, wherein, in the graphical display, the hidden-switch connection is an abstract representation of a physical connection between the first and second functional elements, wherein the abstract representation does not correspond to the routing of the physical connection in the PLD.

* * * * *